United States Patent
Kaneko et al.

[11] Patent Number: 5,869,400
[45] Date of Patent: Feb. 9, 1999

[54] METHOD FOR DRY-ETCHING USING GASEOUS BISMUTH HALIDE COMPOUND

[75] Inventors: Tadaaki Kaneko, Nagano; Takaaki Kawamura, Tokyo, both of Japan

[73] Assignee: Research Development Corporation of Japan, Saitama, Japan

[21] Appl. No.: 655,182

[22] Filed: May 30, 1996

[30] Foreign Application Priority Data

May 30, 1995 [JP] Japan ................................. 7-131920

[51] Int. Cl.⁶ ..................... B44C 1/22; C23F 1/12
[52] U.S. Cl. .................... 438/706; 438/735; 216/73; 216/75; 216/79
[58] Field of Search .................... 438/706, 735; 216/73, 75, 79

[56] References Cited

PUBLICATIONS

Jpn. J. Appl. Phys., vol. 32 (1993), pp. L204–L206, Part 2, No. 2A, Feb. 1, 1993.

Jpn. J. Appl. Phys., vol. 33 (1994), pp. 2307–2310, Part 1, No. 4B, Apr. 1994.

*Primary Examiner*—Bernard P. Codd
*Attorney, Agent, or Firm*—Wenderoth, Lind & Ponack, L.L.P.

[57] ABSTRACT

The present invention provides a method for dry-etching a solid surface with a gaseous bismuth halide compound, which permits achivement of a simple and perfect dry-process for manufacturing of electoric devices, quantum devices etc., giving a high reproducibility.

10 Claims, 1 Drawing Sheet

BiF$_3$ for Etching on Semiconductor Surfaces

METHOD FOR DRY-ETCHING USING GASEOUS BISMUTH HALIDE COMPOUND

BACKGROUND OF THE INVENTION

1. Field of the Invention

The present invention relates to a method for dry-etching. More particularly, the present invention relates to a novel method for dry-etching a solid surface such as a silicon surface or a gallium arsenide surface, which is useful as a basic technology for the manufacture of semiconductor devices.

2. Description of Related Art

In the conventional manufacturing process of semiconductor devices, the etching method of a semiconductor crystal surface is popularly adopted as a basic technology for removing unnecessary portions of an insulating film or a metal thin film along a resist pattern at a high accuracy. As the degree of integration of semiconductor device has increased, however, the pattern width has become smaller. With chemical etching (wet etching) using a solution, which has been used as one etching method, it has now become difficult to cope with need of forming such a high-density pattern. Under these circumstances, attention has focused on a method known as dry-etching. The dry-etching method conducts etching in a relatively clean atmosphere under vacuum, and is therefore expected to enable processing of fine patterned devices.

For silicon (Si), a representative device material, for example, a dry-etching technique using fluorine and chlorine based halogen gases is known. This dry-etching technology makes it possible, in the case of silicon, to remove unnecessary portions of a fine pattern while keeping controllability on a necessary level, and is now considered as a major technique in practice.

In spite of the remarkable progress made in the dry-etching technique, in the case of silicon, it is the common practice to remove an oxide film On a silicon surface by the application of wet etching using an etching liquid such as hydrofluoric acid. The reason is that the oxide film on a silicon surface cannot effectively be removed by conventional dry-etching techniques. Application of wet etching may thus be inevitable.

In the case of this wet etching, however, a problem is that the surface undergoes a change in the course of passing silicon through vacuum after etching. Various measures are of course studied to maintain stability of the surface after removal of the oxide film. Along with the progress toward finer and higher-integration devices, no effective means has yet been found to stabilize the silicon surface after etching, but various problems have become more apparent.

And these problems have also become the same for the other various solid surfaces useful for fine semiconductor devices.

For the purpose of developing a dry-etching technique to form a fine pattern on semiconductor devices, there is naturally a demand for achieving a perfect dry-etching process in which removal of an oxide film on a solid surface such as silicon, GaAs and so on is accomplished by a dry-process. The present circumstances as described above however impose serious restrictions on achievement of a perfect dry-process. This is exerting an important influence also on practical development of the dry-etching technique itself for the formation of a pattern on the device material surface, and hinders efficient improvement permitting high-accuracy patterning.

The present invention was developed in view of the circumstances as described above, and has an object to provide a novel method for etching, which overcomes the restrictions in the conventional etching technique of solid surface, permits dry-etching at a high reproducibility by simple means also for an oxide film on a crystal surface, and allows achievement of a perfect dry-process.

SUMMARY OF THE INVENTION

The present invention provides, as means to solve the above-mentioned problems, a method for dry-etching a solid surface with a gaseous bismuth halide compound.

The present invention provides also methods for dry-etching with a gaseous bismuth halide compound which permits:

1) etching a solid crystal surface of a semiconductor, composed of silicon, gallium arsenide, etc;
2) etching a silicon surface in units of a single atomic layer;
3) selective etching a silicon surface on a differential plane orientation;
4) removal of an oxide film on a silicon surface; and
5) selective etching between a silicon surface and a gallium arsenide surface.

DETAILED DESCRIPTION OF THE INVENTION

Figure 1:
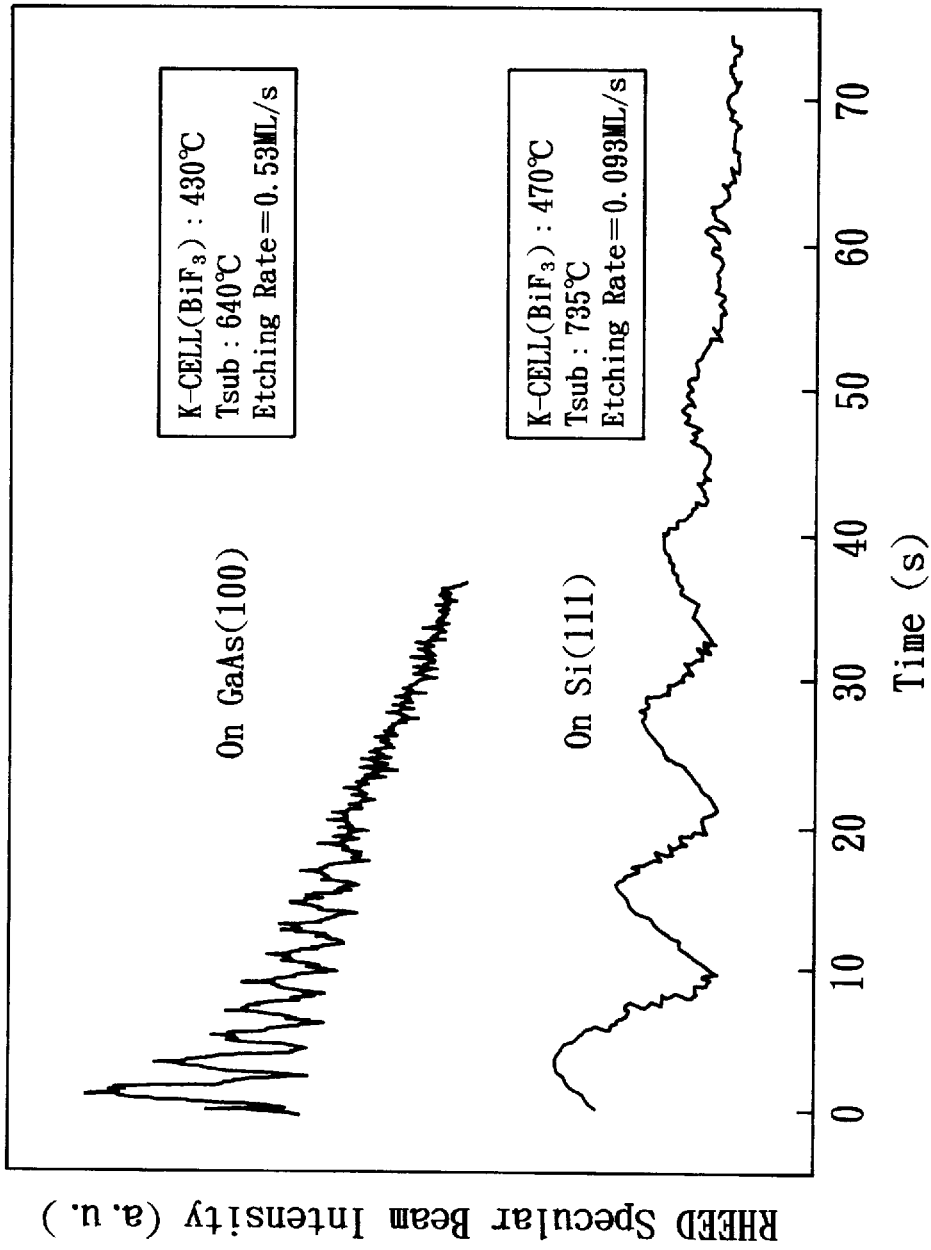
FIG. 1 shows a diagram illustrating the relation between reflection high energy electron diffraction RHEED specular beam intensity and time in case of dry-etching Si(111) surface and GaAs (100) surface by $Bif_3$.

The present invention provides a method for dry-etching a solid surface simply at a high reproducibility by using a gaseous halide compound of bismuth (Bi) as described above in an ultra high vacuum (UHV).

Among solid materials, the silicon surface is generally very rich in reactivity. As a result, this is considered a cause of contamination by impurities since different substances present on the surface are incorporated to reduce the large surface energy. Particularly during growth, removal of these impurities is an important task. On the other hand, means that positively utilizes this property to actively control surface energy is called a "surfactant." This is observed in all materials, and As and Sb are reported to be effective on silicon. However, the purpose in this case is to facilitate hetero-epitaxy into an unmatched lattice system (alleviating distortion to uniform state), incorporation of the surfactant itself into the film is very large.

Recently, Bi has been proposed as a new material exhibiting a surfactant effect. Fabrication of atomically abrupt Si/Ge/Si htero-interfaces was demonstrated using Bi as a surfactant by Kunihiro Sakamoto et al (Jpn. J. Appl. Phys. Vol. 33(1994) pp. 2307–2310).

Bi is characterized in that, although it falls under the V family like As and Sb, the large atom radius permits remarkable inhibition of incorporation into the film. Furthermore, findings were obtained that heating to 400° C. caused desorption of Bi from the surface. With these findings in view, a possibility of using Bi as a carrier carrying halogen atoms to the surface was considered from the point of view of etching.

The conventional etching methods may be considered as accumulation of many trials to carry halogen atoms onto the substrate, and have drawbacks in that an accurate control cannot be conducted as compared with growth, that the surface is contaminated and toxic substances are used in large quantities, and that auxiliary facilities are therefore very complicated and large in scale.

Use of Bi has the following notable features:

(1) It is possible to reduce surface contamination;

(2) As the surface is covered with Bi, it is possible to alleviate and smooth the surface energy intrinsic to the solid surface; and (3) Because introduction is not by means of ionization or in the form of plasma, there is only a little damage to the surface.

By using Bi having these advantages as a carrier of halogen atoms, the functions of conventional wet etching can be replaced by dry-etching.

The halide of bismuth (Bi) used as an etchant in the method of the present invention can be selected from the group consisting of various compounds including those based on $BiF_3$, $BiCl_3$ and $BiBr_3$. Apart from halogen atoms, oxygen or sulfur atoms may be bonded. In all cases, these bismuth halides would be applied onto the solid surface.

It is emphasized that the method of present invention using a gaseous bismuth halide compound as an etchant realizes the capability to etch a semiconductor surface in units of a single atom or single atomic layer. That is, the solid surface is etched in a atomic layer-by-layer fashion with bismuth halide compound.

Applying this method to silicon surface, for example, attention is given to F which has the highest electron negativity among applicable halogen atoms. It has been reported that a clean surface of silicon having a high reactivity can be clearly ground by means of Br. In the present invention, in which Bi reducing a surface energy is used as a carrier, a material having a high electron negativity is chosen. That material is $BiF_3$. It is stable and has a high boiling point of 650° C. (Some reports give a boiling point of 760° or 730° C.) This temperature is within the region in which K-cell control is applicable. As a result, consumption of etchant material is very slight.

According to the method of the present invention, it is possible to remove an oxide film on the solid surface, and to remove residual etchant at a relatively low temperature.

By using the present method for dry-etching a solid surface, an etching accuracy is controlled within units of single atomic layer. Namely, the etching process is stopped at a desirable single atomic layer in accordance with a intensity of RHEED. The etching process is controlled by stopping a supply of a gaseous bismuth halide compound. A K-cell is preferably used for controlling supply of bismuth halide compound by closing a shutter of the K-cell or opening the shutter.

According to the method of the present invention, furthermore, the following functions are available as compared with removal of the oxide film by conventional wet etching using a solution:

(1) It is not necessary to conduct waste liquid disposal;

(2) Uniform and sophisticated etching is applicable, which corresponds to the current tendency toward finer and three-dimensional devices;

(3) It is possible to simplify the production line including elimination of the drying process; and (4) It is possible to selectively etch, such as between silicon surface and gallium arsenide surface.

Also in the method of the present invention, the ultra high vacuum (UHV) condition is adopted. However, this ultra high vacuum (UHV) condition required by the dry-process and various other conditions for introduction and discharge of an etchant gas and heating of the substrate largely vary in accordance with the corresponding conventional methods within the scope of the present invention.

The method of the present invention is now described further in detail by means of working examples.

Example 1

$BiF_3$ was supplied as an etchant to Si(111) and a surface oxide film was removed by dry-etching. By heating the etching-treated surface, there was available a clean and flat silicon surface. Subsequently, this clean surface was etched in a layer-by-layer fashion with $BiF_3$: about ten layers of oscillation of reflection high energy electron diffraction (RHEED) representing etching in units of single atomic layer were observed. Residual Bi on the surface could be removed by heating the surface to about 400° C. Because, without irradiation of $BiF_3$ tinder the same conditions, no RHEED pattern is observed, $BiF_3$ is considered to remove the oxide film on the Si surface.

Example 2

A Si(100) plane and a Si(111) plane were placed on a substrate holder to observe differences. This showed that the Si(100) plane became largely rougher, while the Si(111) plane became smoother, as observed from changes in the RHEED pattern. The etching rate (ER) is therefore considered to be:

$$ER(100) > ER(111)$$

This is attributable to the fact that the supply rate limited range for the decomposition of $BiF_3$ is not reached on Si surface even 730° C., and the decomposition rate limited range has kept yet. The Si(100) plane has a larger number of dangling bonds. Reactivity of the surface is considered to be simply proportional to this number.

Example 3

The difference in reactivity between Si(111) and GaAs (100) was investigated.

FIG. 1 shows a diagram illustrating the relation between RHEED specular beam intensity and time for etching Si and GaAs in units of single atomic layer.

The period of this oscillation corresponds to etching of single layer [double layer (a coupled single layer at Si(111)), a coupled GaAs single layer at GaAs(100)]. We could confirm the progross of etching in units of a single layer.

ER was investigated from observation of RHEED oscillation on the GaAs(100) plane, the supply rate limited range was almost satisfied on GaAs at a substrate temperature of 500° C. In decomposition of $BiF_3$, therefore, exchange of electrons with the substrate is very important: the difference in this catalyst-like function (i.e., between the GaAs substrate and the Si substrate) represents a large difference in ER (>50). In the area of device application, growth of GaAs on Si is now a subject of active discussion The selective etching would therefore become an important technology.

According to the prior arts for etching GaAs, Si layers (Si as a dopant) remain on a crystal surface. However, as described in FIG. 1, the present method realizes the capability to etch both of GaAs and Si.

Additionally, by using the present method, AlAs was etched with a similar etching rate (ER) of Si case. Then, the present method is also used for etching AlAs on GaAs.

According to the present invention, as described above in detail, it is now possible to carry out removal of an oxide film on a solid surface and etching of the surface in units of a single atomic layer, both by dry-etching. It permits achievement of a simple and perfect dry-process giving a high reproducibility.

What is claimed is:

1. A method for dry-etching a solid surface, which comprises the step of etching a solid surface with a gaseous bismuth halide compound.

2. The method for dry-etching a solid surface according to claim 1, wherein the solid surface is a solid crystal surface of a semiconductor.

3. The method for dry-etching a solid surface according to claim 2, wherein the solid crystal surface of the semiconductor is comprised of at least one compound selected from the group consisting of silicon and gallium arsenide.

4. The method for dry-etching a solid surface according to claim 3, which comprises etching a silicon surface of a semiconductor with a gaseous bismuth halide compound, wherein etching depth is controlled in units of a single atomic layer.

5. The method for dry-etching a solid surface according to claim 3, which comprises selectively etching a solid surface comprised of both silicon and gallium arsenide, wherein a gallium arsenide layer is formed on a silicon surface.

6. The method for dry-etching a solid surface according to claim 5, wherein the etching with the gaseous bismuth halide compound is performed by etching the solid surface a single atomic layer at a time.

7. The method for dry-etching a solid surface according to claim 1, wherein etching depth is controlled in units of a single atomic layer.

8. The method for dry-etching a solid surface according to claim 1, wherein the solid surface comprises an oxide.

9. The method for dry-etching a solid surface according to claim 1, which comprises etching an oxide layer on a surface of a semiconductor crystal.

10. The method for dry-etching a solid surface according to claim 9, wherein the semiconductor is comprised of silicon.

* * * * *